United States Patent
Bauer et al.

(10) Patent No.: US 7,834,460 B2
(45) Date of Patent: Nov. 16, 2010

(54) METHOD FOR MANUFACTURING AN ELECTRONIC COMPONENT AND CORRESPONDING ELECTRONIC COMPONENT

(75) Inventors: Michael Bauer, Nittendorf (DE); Ludwig Heitzer, Regensburg (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 187 days.

(21) Appl. No.: 11/746,390

(22) Filed: May 9, 2007

(65) Prior Publication Data
US 2007/0290346 A1    Dec. 20, 2007

(30) Foreign Application Priority Data
May 11, 2006    (DE) .................. 10 2006 022 067

(51) Int. Cl.
*H01L 23/52* (2006.01)
*H01L 29/40* (2006.01)
(52) U.S. Cl. ................. 257/773; 257/783; 257/E23.127
(58) Field of Classification Search ................. 257/773, 257/783, E23.127
See application file for complete search history.

(56) References Cited

U.S. PATENT DOCUMENTS

| 6,940,156 B2 | 9/2005 | Bauer et al. |
| 7,538,415 B1* | 5/2009 | Lin et al. ............ 257/673 |
| 2006/0278993 A1* | 12/2006 | Trezza et al. ........... 257/777 |
| 2007/0182020 A1* | 8/2007 | Trezza et al. ........... 257/777 |

FOREIGN PATENT DOCUMENTS

| EP | 0779653 | 6/1997 |
| JP | 05062981 | 3/1993 |

\* cited by examiner

*Primary Examiner*—Ngan Ngo
(74) *Attorney, Agent, or Firm*—Dicke, Billig & Czaja, PLLC

(57) ABSTRACT

The invention pertains to a method for manufacturing an electronic component with a semiconductor element (1) that is contacted and fixed on a substrate surface (2). The method is characterized in that the rear side of the semiconductor element and/or the substrate surface is coated with an adhesive structure consisting of a first component (3) that solidifies, particularly hardens or cures, and an electrically conductive second component (4) that does not solidify, wherein the semiconductor element is bonded to the substrate surface in a contacting fashion. The electronic component is characterized in that a structured adhesive layer arranged between the semiconductor element and the substrate surface comprises a solidifying first component (3) and an electrically conductive non-solidifying second component (4).

9 Claims, 3 Drawing Sheets

METHOD FOR MANUFACTURING AN ELECTRONIC COMPONENT AND CORRESPONDING ELECTRONIC COMPONENT

CROSS REFERENCE TO RELATED APPLICATION

This Utility Patent Application claims priority to German Patent Application No. DE 10 2006 022 067.6 filed on May 11, 2006, which is incorporated herein by reference.

BACKGROUND

The basic structure of modern electronic components consists of a correspondingly doped or comparably designed semiconductor element that fulfills the function of the component and a substrate for realizing the electrical and thermal contacting of the semiconductor element. The semiconductor element and the substrate region situated in the immediate vicinity thereof are usually encapsulated in a suitable fashion so as to provide protection against environmental influences. The electrical connection of the semiconductor element is produced from at least one contact extending out of the encapsulation to the substrate and from the substrate into the semiconductor element, wherein this connection ultimately extends from the semiconductor element via the substrate to at least one other contact that extends out of the encapsulation to an external circuit.

Costly soldering methods are currently utilized for realizing the electrical and thermal contacting of the semiconductor element on the substrate, wherein these soldering methods require a complex metallization of the rear side of the semiconductor element. It is also very problematic to solder the semiconductor element to a substrate surface of gold that provides particular advantages with respect to electrical and thermal conductivity. Contraction cavities and delaminations frequently occur in this connecting technique and lead to unjustifiable reliability problems of the electronic component. This is the reason why the soldering of gold surfaces is nowadays no longer carried out and less valuable substrate surfaces are used.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
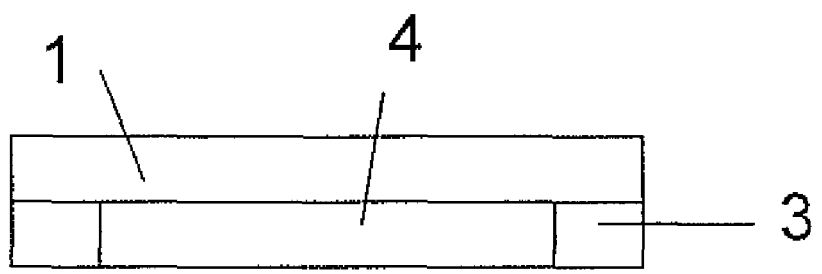
FIG. 1 illustrates a section through an exemplary semiconductor element.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a method for manufacturing an electronic component, in which the electrical and thermal contacting of the semiconductor element can be realized in a much simpler and therefore more cost-efficient fashion and a reliable connection can also be ensured on a gold substrate. The invention furthermore provides an electronic component that can be inexpensively manufactured and in which the electrical and thermal contacting on the substrate is realized in a simple and reliable fashion.

According one embodiment of to the invention, the manufacturing method for an electronic component with a semiconductor element that is contacted and fixed on a substrate surface is characterized in that the rear side of the semiconductor element and/or the substrate surface is coated with an adhesive structure consisting of a first component that solidifies, particularly hardens or cures, and an electrically conductive second component that does not solidify, wherein the semiconductor element is bonded to the substrate surface in a contacting fashion.

In contrast to the utilization of conventional soldered contacts that are known from the state of the art and used in the manufacture of an electronic component, the invention proposes to bond the semiconductor element onto the substrate surface. This means that the costly soldering process that is additionally complicated due to the required metallization of the rear side can be entirely replaced with the application of a combination of adhesives. A metallization of the semiconductor element is not absolutely imperative in this case. When the semiconductor element is fixed on the substrate, it is therefore possible to completely eliminate the metallization of the rear side or to provide some technological flexibility, according to which the rear side is either metallized or not depending on the respective requirements. In addition, the interactions between the solder and the gold-coated substrate are eliminated in the bonding of the semiconductor element such that it is possible, in principle, to provide substrates that are metallized with gold for the manufacture of the electronic component. The solidifying component ensures that the semiconductor element is mechanically fixed on and thermally contacted with the substrate while the non-solidifying component primarily serves for realizing the electrical contacting.

The coating on the rear side can be realized in different ways. According to a first embodiment of the manufacturing method, the first and the second component are printed on the semiconductor element and/or the substrate surface.

In a second embodiment of the manufacturing method, the first and the second component are sprayed on the semiconductor element and/or the substrate surface. A uniform and precise coating of the respective surfaces can be realized by using printing as well as by using spraying.

However, the printing process and the spraying process can also be combined for the coating of the rear side. In this case, one of the two components is printed on while the other component is sprayed on.

The solidifying first component serves for producing an edge region that is at least sectionally coated with the first component, wherein a central region is at least sectionally coated with the non-solidifying second component. This results in a stable structure of both adhesive components, in which the stable edge region encloses the free-flowing inner central region such that the second component is prevented from seeping or flowing out and a maximum contact surface between the semiconductor element and the substrate is ensured.

It is also possible to produce an adhesive structure in which first strips consisting of the first component are applied on the semiconductor element such that they alternate with second strips consisting of the second component. The mounting conditions, the possible mechanical tensions and the required current flow between the semiconductor element and the substrate surface need to be taken into account in the selection of the respectively suitable adhesive structure.

In one embodiment of the manufacturing method, a supplementary structuring is realized on the substrate surface by applying a structured metal surface, particularly a structured gold surface. The structured metal surface improves the electrical and thermal contact between the adhesive structure and the substrate surface.

An electronic component featuring a contacting connection between a semiconductor element and a substrate surface is characterized in that a structured adhesive layer arranged between the semiconductor element and the substrate surface comprises a solidifying first component and an electrically conductive non-solidifying second component.

According to one embodiment, the first component essentially extends along an edge section of the semiconductor element while the second component is essentially arranged in a central region of the semiconductor element.

According to another embodiment, the first and the second component are alternately arranged in a strip-shaped structure.

The second non-solidifying component preferably consists of a very viscous, permanently adherent pressure sensitive adhesive with electrically conductive particles embedded therein. If the electrically conductive particles are provided in a sufficient density, they form electrically conductive bridges between the rear side of the semiconductor element and the substrate surface.

The substrate surface features a supplementary structured metallization, particularly a structured gold surface, so as to realize a more intensive electrical, thermal and mechanical contact between the adhesive layer and the substrate surface.

In one embodiment, the structured metallization is preferably adapted to the structured adhesive layer of the semiconductor element.

It is to be understood that the features of the various exemplary embodiments described herein may be combined with each other, unless specifically noted otherwise.

FIG. 1 illustrates a section through an exemplary semiconductor element 1. The semiconductor element is schematically illustrated in the following embodiments. Depending on the concrete design of the electronic component, the semiconductor element may be realized in the form of a single diode element or transistor element with the respectively required structure. However, it is also possible for the semiconductor element to form a semiconductor chip with an integrated circuit. The internal structure of the semiconductor element is not important for the following description.

The side of the semiconductor element that faces the substrate surface features an adhesive structure. This structure consists of a solidifying first component 3 and an electrically conductive non-solidifying second component 4. According to this figure, the first component 3 covers the edge of the corresponding surface of the semiconductor element while the second component 4 fills out the central region, i.e., the center of this surface.

Figure 2:
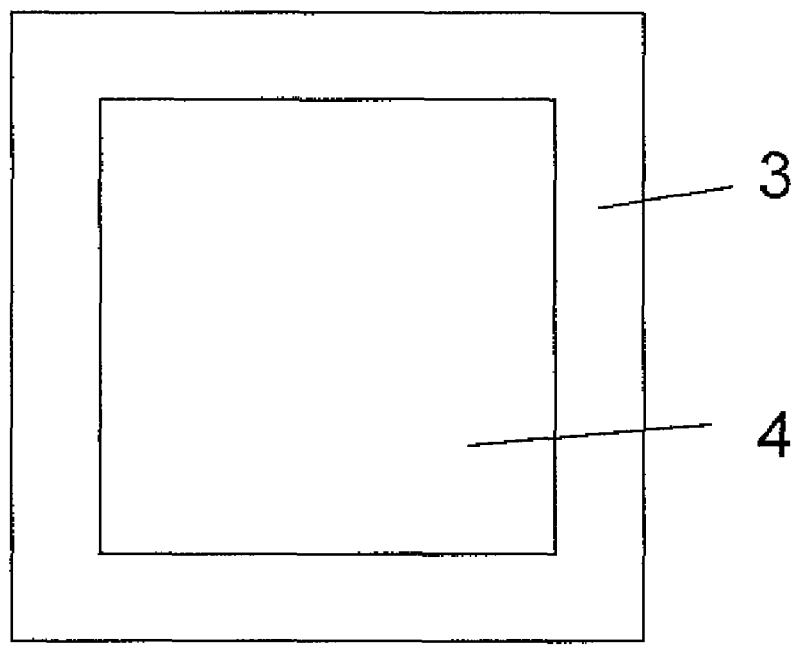
FIG. 2 illustrates an exemplary coated side of the semiconductor element.

FIG. 2 illustrates a top view of the coated side of the semiconductor element. One can clearly distinguish the frame-shaped region formed by the first component 3 and the region that is coated with the second component 4 and framed by the first component.

Figure 3:
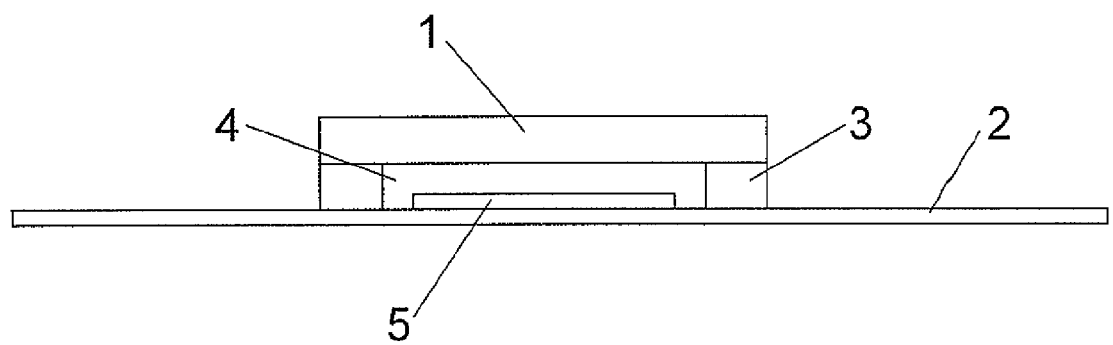
FIG. 3 illustrates the semiconductor element illustrated in the preceding figures on a substrate.

FIG. 3 illustrates the semiconductor element according to FIGS. 1 and 2 after the adhesive connection with a substrate surface 2 is produced. The conventional encapsulation of the electronic component and the required design of the substrate for the respective type of electronic component are not illustrated in this figure.

In the region of the second component 4, the surface of the substrate features a metallization 5, particularly a gold metallization. The metallization is structured in this case, i.e., it corresponds at least to the geometric shape of the region of the second component 4 on the rear side of the semiconductor element. In the embodiment illustrated in FIGS. 1 and 2, for example, the metallization has a square shape in which the side lengths are slightly smaller than the side lengths of the central region of the semiconductor element. Thusly structured metallizations may be realized, for example, by using a vaporization technique or another corresponding chemical vapor deposition method, in which corresponding vapor deposition masks are used on the substrate surface.

Figure 4:
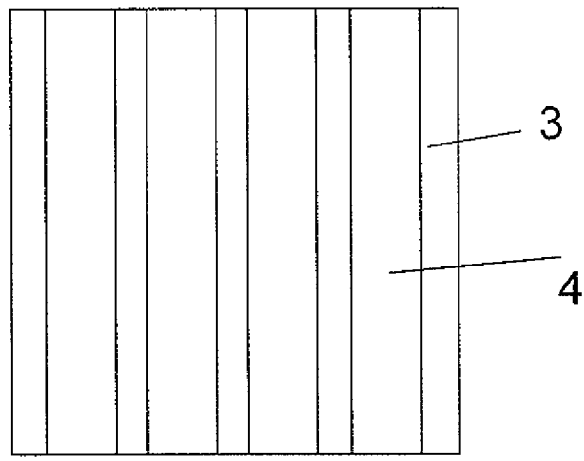
FIG. 4 illustrates another embodiment of the coated side of the semiconductor element with an alternating strip-shaped adhesive structure.

The components 3 and 4 may be arranged differently within the adhesive structure. Another example is illustrated in FIG. 4. In the adhesive structure illustrated in this figure, the first component 3 and the second component 4 form an alternating strip-shaped arrangement. In this case, the strips of the solidifying component 3 stabilize the second component 4 situated therebetween. The structure illustrated in FIG. 4 may also be combined with the structure according to FIG. 2. In such an embodiment, the first component 3 is arranged in the edge region of the coated surface of the semiconductor and furthermore divides the central region filled with the second component 4 in a strip-shaped fashion.

Figure 5:
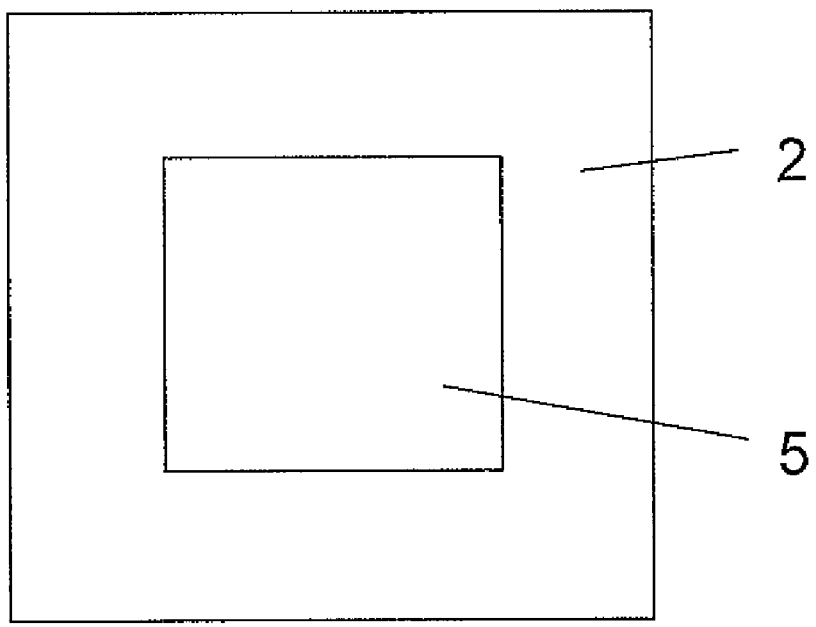
FIG. 5 illustrates a first embodiment of a structured metallization on the substrate surface.
Figure 6:
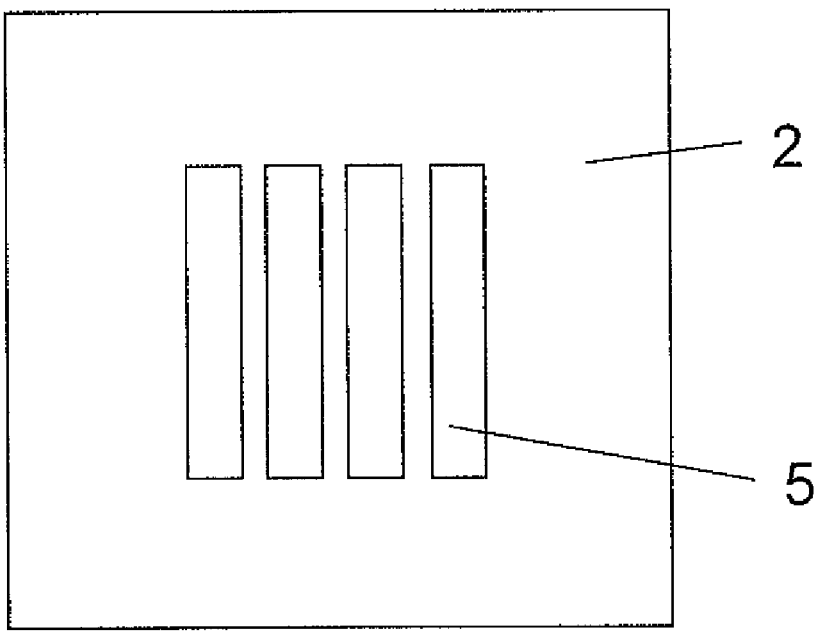
FIG. 6 illustrates another embodiment of structured metallization on the substrate surface.

The structured metallization on the substrate surface can also be realized differently and adapted, in particular, to the structure of the adhesive surface on the rear side of the semiconductor element. FIGS. 5 and 6 illustrate exemplary embodiments of the structured metallization.

In FIG. 5, the structured metallization 5 on the substrate surface 2 has an essentially square shape that matches the adhesive structure according to FIG. 2 such that the metallization is entirely situated within the region covered by the second component 4 once the semiconductor element is bonded thereto. FIG. 6 illustrates a strip-shaped metallization that corresponds to the strip-shaped adhesive structure illustrated in FIG. 4. In this example, the strips of the metallization essentially correspond to the strips in the alternating adhesive structure according to FIG. 4.

The structured adhesive surface can be applied onto the rear side of the semiconductor element with different methods. According to a first method, the components of the adhesive are sprayed onto the rear side of the semiconductor element. This is realized, for example, by initially covering the central region of the rear side to be coated with a shadow screen that is pivoted into the path of the spray jet. The first component of the adhesive layer is then sprayed onto the edge region of the surface to be coated that is not covered by the screen. In the next step, a perforated screen is moved into the path of the jet such that it covers the edge region of the rear side of the semiconductor element that was just coated with the first component. The second component is then sprayed onto the semiconductor element.

In order to produce the alternating adhesive structure that is illustrated, for example, in FIG. 4, a screen that features several slits is used and one component is initially sprayed on through a row of slits. The screen is then displaced by essentially the width of one slit and the other component is sprayed on. When applying an alternating adhesive structure consisting of a first and a second component that is framed by the first component, combinations of shadow screens, perforated screens and slit screens are used accordingly.

Another option for applying the adhesive layer are printing methods, particularly screen printing or offset printing methods. In this case, the semiconductor elements are guided through a screen printing or offset printing machine, the fabric or offset printing form of which simultaneously prints the first and the second component onto the rear side of the semiconductor element. A simultaneous printing of both components is advantageous because the successive printing of the first and the second component can lead to smearing of the adhesive that is initially printed on the surface. If the rear side of the semiconductor element should be provided with the adhesive layer, it is advantageous to utilize the above-described spraying method because the associated mechanical stresses, to which the semiconductor element is subjected, are significantly reduced in this case.

The application of the adhesive layer is either carried out instead of an otherwise conventional metallization of the rear side or after the metallization thereof. The application of solder is eliminated in this case.

It is also possible, in principle, to apply the adhesive layer onto a location of the substrate provided for this purpose rather than the entire rear side of the semiconductor element. In this case, the substrates are guided through a spraying or printing device instead of the semiconductor elements and are provided with the adhesive layer. The above-described functional sequence of the coating process is not significantly changed in this case. One advantage of coating the substrate can be seen in that the adhesive layer can be positioned directly on the substrate and therefore in a more precise fashion, wherein the adhesive layer is also no longer subjected to the inaccuracies during the subsequent attachment of the semiconductor element.

The solidifying first component 3 may consist of a conventional adhesive material used in the manufacture of electronic components or precision parts. Single-component adhesives that are hardened by using radiation while undergoing radical polymerization, wherein the hardening time of these adhesives can be precisely planned based on the beginning of the irradiation. These materials can be hardened, in particular, by using UV or IR radiation. Adhesives of this type are essentially free of solvents and therefore do not contaminate the contact surface between the semiconductor element and the substrate surface due to the release and diffusion of a solvent.

The non-solidifying second component 4 may consist of an adhesive without solidifying characteristics. Adhesives of this type are also referred to as pressure-sensitive adhesives. These adhesives remain very viscous and remain permanently adherent after their application. Electrically conductive pressure-sensitive adhesives are used in the inventive method. In this case, either material of the second component that is not electrically conductive is provided with admixed conductive particles, for example, microscopic metallic spheres in a sufficient number and density for forming electrically conductive bridges in a sufficiently thin layer, or the polymer material of the pressure-sensitive adhesive has a conductive molecular structure.

The non-hardening structure of the adhesive remains viscous and prevents the elimination of the adhesive connection, i.e., a separation of the adhesive layer from the substrate surface or the semiconductor material due to mechanical tensions during or after the hardening process, as well as an associated break of the electric contact. In addition, the viscous adhesive practically fills out the entire available space due to capillary effects.

A structured metallization of the substrate surface is advantageous with respect to producing an optimal connection with the viscous second component. In this respect, structured gold surfaces have proved particularly suitable such that a substrate coated with gold can be utilized in this case.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electronic component comprising:
   a contacting connection between a semiconductor element and a substrate surface;
   a structured adhesive layer between the semiconductor element and the substrate surface comprising a solidifying first component and an electrically conductive non-solidifying second component separate from the first component, the first component and the second component being arranged to form the structured adhesive layer.

2. The electronic component of claim 1, comprising wherein the first component is arranged along an edge section of the semiconductor element and the second component is arranged in a central region of the semiconductor element.

3. The electronic component of claim 1, comprising wherein the first and the second component are arranged in the form of an alternating strip-shaped structure.

4. The electronic component of claim 1, comprising wherein the non-solidifying second component consists of a very viscous, permanently adherent pressure sensitive adhesive with electrically conductive particles embedded therein.

5. The electronic component of claim 1, comprising wherein the substrate surface includes a metallization layer.

6. The electronic component of claim 5, comprising wherein the metallization has a structure that is adapted to the structured adhesive layer of the semiconductor element.

7. The electronic component of claim 5, where the metallization layer comprises a structured gold layer.

8. An integrated circuit comprising:
   a semiconductor;
   a substrate having a surface;
   a contacting connection between the semiconductor element and the substrate surface, comprising a structured adhesive layer between the semiconductor element and the substrate surface including a solidifying first component layer and an electrically conductive non-solidifying second component layer separate from the first component layer.

9. The integrated circuit of claim 8, comprising wherein the first component is arranged along an edge section of the semiconductor element and the second component is arranged in a central region of the semiconductor element.

* * * * *

UNITED STATES PATENT AND TRADEMARK OFFICE
CERTIFICATE OF CORRECTION

| | | |
|---|---|---|
| PATENT NO. | : 7,834,460 B2 | Page 1 of 1 |
| APPLICATION NO. | : 11/746390 | |
| DATED | : November 16, 2010 | |
| INVENTOR(S) | : Bauer et al. | |

It is certified that error appears in the above-identified patent and that said Letters Patent is hereby corrected as shown below:

Front Page, Abstract, delete current Abstract and insert in place thereof --A method for manufacturing an electronic component and correspondent electronic component is disclosed. One embodiment provides a semiconductor element that is contacted and fixed on a substrate surface. The electronic component is a structured adhesive layer arranged between the semiconductor element and the substrate surface, including a solidifying first component and an electrically conductive non-solidifying second component.--.

Signed and Sealed this
Eighth Day of March, 2011

David J. Kappos
*Director of the United States Patent and Trademark Office*